United States Patent [19]

Lynes et al.

[11] 4,099,260
[45] Jul. 4, 1978

[54] BIPOLAR READ-ONLY-MEMORY UNIT HAVING SELF-ISOLATING BIT-LINES

[75] Inventors: Dennis Joseph Lynes, Madison, N.J.; Peter Theodore Panousis, Salisbury Township, Lehigh County; Robert Leonard Pritchett, Bath, both of Pa.

[73] Assignee: Bell Telephone Laboratories, Incorporated, Murray Hill, N.J.

[21] Appl. No.: 724,652

[22] Filed: Sep. 20, 1976

[51] Int. Cl.² .................................... G11C 17/06
[52] U.S. Cl. ............................. 365/105; 357/15
[58] Field of Search .............. 340/173 SP, 173 R; 357/15

[56] References Cited

U.S. PATENT DOCUMENTS 3,774,170  11/1973  Koch .......................... 340/173 SP

OTHER PUBLICATIONS

Crowder et al., Silicon Schottky Barrier Bistable Memory Element, IBM Technical Disclosure Bulletin, vol. 15, No. 3, 8/72, p. 891.
Panovsis et al., GIMIC-O-A Low Cost Non-Epitaxial Bipolar LSI Technology Suitable for Application to TTL Circuits, IEDM Digest of Technical Papers, 12/74, pp. 515–518.
Broom et al., Vertical Schottky Diode–Memory Device, IBM Technical Disclosure Bulletin, vol. 15, No. 7, 12/72, p. 2158.

*Primary Examiner*—Stuart N. Hecker
*Attorney, Agent, or Firm*—Lucian C. Canepa

[57] ABSTRACT

A semiconductor read-only-memory (ROM) unit fabricated in large-scale-integrated form utilizing the formation of self-isolating bit-line surface regions of one conductivity type directly in a bulk region of the opposite conductivity type. Channel-stop regions of the same conductivity type as the bulk region are formed in the spaces between bit-line regions. Metallic word-lines overlying and orthogonal to the bit-line regions are formed, separated from the bit-line regions by an insulating layer. The memory cell comprises a single Schottky diode. Such a diode is made or not at each word-line/bit-line crossover location depending respectively on whether or not an aperture is formed in the insulating layer during fabrication to permit the word-line to contact a lightly doped portion of the bit-line. ROM units formed by this method are characterized by small area, high speed, low power dissipation and low cost.

9 Claims, 7 Drawing Figures

BIPOLAR READ-ONLY-MEMORY UNIT HAVING SELF-ISOLATING BIT-LINES

BACKGROUND OF THE INVENTION

This invention relates to integrated circuits and, more particularly, to a read-only-memory (ROM) unit fabricated in large-scale-integrated (LSI) form.

Read-only memories are well-known units that constitute one of the basic building blocks useful in assembling a variety of practical electronic systems such as microprocessors, telephone PBXs and electronic key systems. In recent years, considerable effort has been directed at fabricating such systems, including the ROM units thereof, in LSI form. In fact much of this effort has been concerned with designing improved ROM units.

SUMMARY OF THE INVENTION

An object of the present invention is to improve the design and facilitate the fabrication of ROM units.

More specifically, an object of this invention is an LSI ROM unit characterized by small area, high speed, low cost and low power dissipation.

Briefly, these and other objects of the present invention are realized in a specific illustrative ROM unit that is fabricated in LSI form by utilizing the bipolar technology known as GIMIC-O. The basic memory cell of the unit is a single Schottky diode. Such a diode is made or not at each bit-line/word-line intersection of a matrix array depending respectively on whether or not a contact window is formed at the intersection during fabrication of the unit. By utilizing this approach, it is feasible, for example, to construct a small-area 16K ROM unit characterized by high speed, low cost and low power dissipation.

BRIEF DESCRIPTION OF THE DRAWING

A complete understanding of the present invention and of the above and other objects, features and advantages thereof may be gained from a consideration of the following detailed description presented hereinbelow in connection with the accompanying drawing, in which.

DETAILED DESCRIPTION

Figure 1:
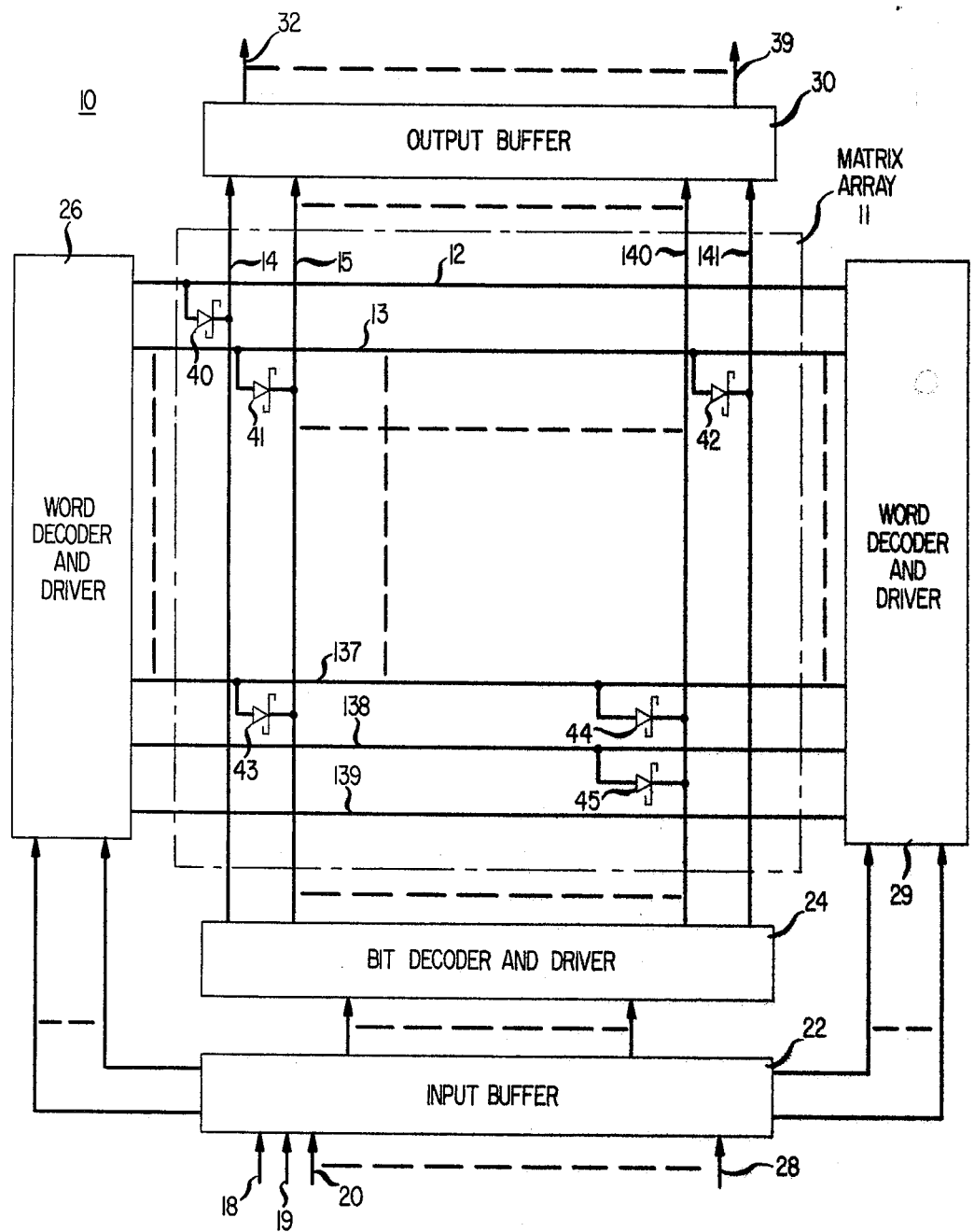
FIG. 1 is an overall schematic representation of a specific illustrative ROM unit made in accordance with the principles of the present invention.

FIG. 1 is a schematic showing of an ROM unit 10 which includes as one constituent thereof a matrix array 11 that illustratively embodies the principles of this invention. The matrix 11, which is included within dashed lines in FIG. 1, comprises a coordinate array that includes multiple horizontal and vertical conductors whose intersections define a multiplicity of storage locations. In practice these intersections are usually grouped to be representative of multiple plural-bit words. The make-up of each bit in a word is determined by whether or not a device is connected between the orthogonal conductors forming the respective intersection definitive of the bit.

In accordance with the principles of the present invention, the device that is formed or not at each intersection of the matrix array 11 of FIG. 1 is a single Schottky barrier device, which is a metal-semiconductor diode. Thus, for example, the presence of a Schottky diode at an intersection may represent a "1" indication and the absence of a Schottky diode may represent a "0," or vice versa. By utilizing either format, any user-specified representation of multiple plural-bit words may be established in the depicted unit 10 during fabrication thereof.

By way of a particular illustrative example, it will be assumed herein that the matrix array 11 of the ROM unit 10 of FIG. 1 comprises 128 horizontal or word-line conductors 12, 13 . . . 137, 138, 139 and 128 vertical or bit-line conductors 14, 15 . . . 140, 141. The 16,384 intersections formed thereby are organized in a conventional way to be representative, for example, of 2,048 8-bit words. Hence the unit 10 including such an array is commonly designated a 16K ROM.

In a manner well known in the art, any specified one of the 2,048 words stored in the matrix array 11 of FIG. 1 may be addressed by applying to the unit 10 a corresponding 11-bit address word. The respective digits of the address word are applied to input conductors 18, 19, 20 . . . 28. Such a word is routed via an input buffer 22 to a bit decoder and driver 24 and to two word decoders and drivers 26 and 29. In response thereto, the units 24, 26 and 29 activate 8 specified ones of the 128 bit lines 14, 15 . . . 140, 141 and a single specified one of the 128 word lines 12, 13 . . . 137, 138, 139. In that way the bits of a selected 8-digit word stored in the matrix array 11 are respectively applied via a standard output buffer 30 to output conductors 32 . . . 39.

In accordance with one aspect of the principles of the present invention, both the matrix array 11 and the conventional units 22, 24, 26, 29 and 30 of FIG. 1 are fabricated in the form of a microminiature semiconductor chip utilizing the bipolar integrated-circuit technology known as GIMIC-O. (For a description of GIMIC-O see the article by P. T. Panousis and R. L. Pritchett entitled "GIMIC-O — A Low Cost Non-Epitaxial Bipolar LSI Technology Suitable for Application to TTL Circuits," *IEDM Digest of Technical Papers,* December 1974, pages 515–518.) Advantageously, the circuit configurations of the aforespecified units are formed utilizing transistor-transistor logic (TTL) circuits.

In accordance with another aspect of this invention, the matrix array 11 of FIG. 1 is fabricated in GIMIC-O form to include only a single Schottky diode at each of specified ones of the aforementioned 16,384 intersections. Multiple chips each including such an array with its associated units 22, 24, 26 and 29 can therefore be made on a semiconductor wafer in a low-cost batch fabrication process.

Illustratively, the aforementioned fabrication process may include a coded mask definitive of a userspecified storage format in the matrix array 11 of FIG. 1. By means of such a mask, a wafer is processed to form thereon multiple chips each comprising an ROM unit having a specified pattern of Schottky diodes at the multiple intersections of the matrix array thereof.

A particularly advantageous apparatus with which to form the coded masks is described in U.S. Pat. No. 3,900,737, issued Aug. 19, 1975 to R. J. Collier and D. R. Herriott, entitled "Electron Beam Exposure System." With such a computer-controlled system it is feasible to form a single master mask structure that includes thereon plural differently coded masks. In processing an associated wafer with such a master mask to fabricate multiple chips each including an ROM unit, plural different memory formats may be embodied in the chips during a single batch fabrication procedure. Thus, a given wafer may be made to contain either multiple identical ROM units or a number of differently coded ROM units.

With a computer-controlled system of the type specified above, it is also feasible to directly process a semiconductor wafer in accordance with the GIMIC-O technology to form thereon multiple identical or differently coded ROM units. In that case, separate coded mask structures are, of course, not required in the fabrication process.

In the matrix array 11 of FIG. 1 a single Schottky diode is indicated as having been formed at each of selected ones of the represented intersections. Thus, for example, a single such diode 40 is shown connected between the horizontal word line 12 and the vertical bit line 14. Other Schottky diodes 41 through 45 are shown respectively connected at other intersections of the depicted array 11. Still others of the intersections represented in FIG. 1 have no diodes connected thereat (see, for example, the intersection formed by the conductors 12 and 15).

A set of specific illustrative steps to be followed to form a matrix array 11 of the particular type shown in FIG. 1 will now be described with the aid of FIGS. 2 through 7. These steps, which constitute an integrated-circuit fabrication procedure in accordance with the aforementioned GIMIC-O bipolar technology, are also applicable to the formation in a single semiconductor chip of the units 22, 24, 26, 29 and 30 associated with the matrix array 11 (as shown in FIG. 1). Advantageously, these associated units are made from TTL-compatible circuits in a batch fabrication procedure at the same time that the matrix array 11 is being formed. Emphasis hereinbelow, however, will be directed only to forming the array 11.

Figure 2:
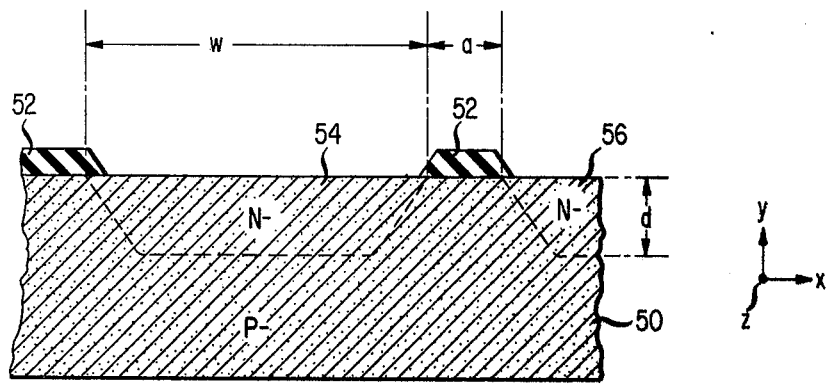
FIGS. 2 through 6 are cross-sectional side views of a portion of an LSI version of the matrix array of the FIG. 1 unit.

FIG. 2 shows a p-type semiconductor substrate 50 that has a resistivity of about 8–20 ohm-centimeters. By conventional lithographic techniques (utilizing, for example, the aforementioned Collier-Herriott apparatus) a 0.8-micrometer-thick masking layer 52 of silicon dioxide formed on the top surface of the substrate 50 is selectively patterned. The bit-line regions of the array are formed in unmasked portions of the substrate by ion implanting a shallow phosphorus layer (at, for example, an energy of 150K electron volts and a concentration of $1 \times 10^{13}$ atoms per square centimeter) and diffusing the layer at a temperature of about 1250° C for about 180 minutes to a depth $d$ of approximately 8 micrometers. The width $w$ of each bit-line region is about 15 micrometers. Plural such $n^-$ regions (such as those designated 54 and 56 in FIG. 2) are formed in the substrate 50. In fact, in the particular array assumed earlier above, 128 such spaced-apart regions or bit lines are simultaneously formed in the substrate 50.

In one particular illustrative embodiment of the present invention, the bit-line regions are spaced apart by a distance $a$ (FIG. 2) of about 5 micrometers and each such region extends approximately 2 millimeters in the z direction. These regions correspond respectively to the vertical bit lines 14, 15 ... 140, 141 shown in FIG. 1.

Figure 3:
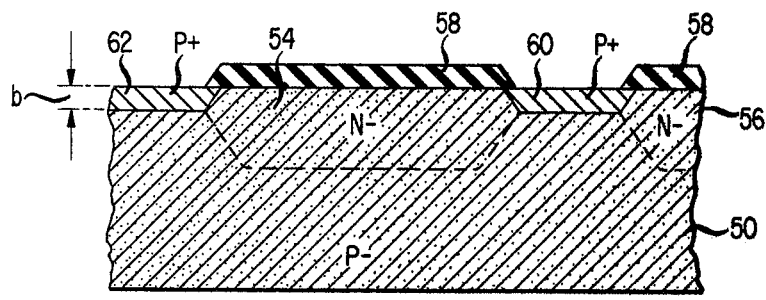
Figure 4:
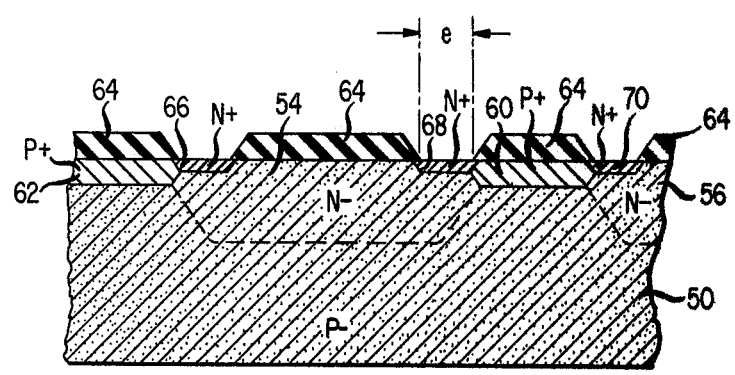

The next step in the herein-considered illustrative fabrication procedure is indicated by FIG. 3. Another selectively patterned silicon dioxide layer 58 is formed by standard techniques on the top surface of the substrate 50 to serve as a masking layer for ion implantation. Channel stops comprising $p^+$ regions, such as those designated 60 and 62 in FIG. 3, are then formed in the substrate 50. These stop regions, which are coextensive with the bit-line regions 54 and 56, are made, for example, by a two-stage boron-implant step (an implant at about 300K electron volts and a concentration of $1.6 \times 10^{13}$ atoms per square centimeter followed by an implant at about 50K electron volts and a concentration of $0.9 \times 10^{14}$ atoms per square centimeter). The resulting stops 60 and 62 have a depth $b$ of about 1.2 micrometers, with a peak in the impurity concentration thereof occurring at a depth of approximately 0.7 micrometers.

Subsequently, still another selectively patterned silicon dioxide masking layer 64 (FIG. 4) is formed on the top surface of the substrate 50. $N^+$ regions 66, 68 and 70 are formed by diffusion in unmasked portions of the bit-line regions 54 and 56. Illustratively, these regions 66, 68 and 70 are formed by diffusing phosphorus at approximately 900° C for about 35–40 minutes to achieve a resistivity of less than approximately 30 ohms per square. The regions 66, 68 and 70, which are designed to enhance the conductivity of the bit-line regions, have a depth $c$ of about 0.6 micrometer and a width $e$ of approximately 5 micrometers.

Figure 5:
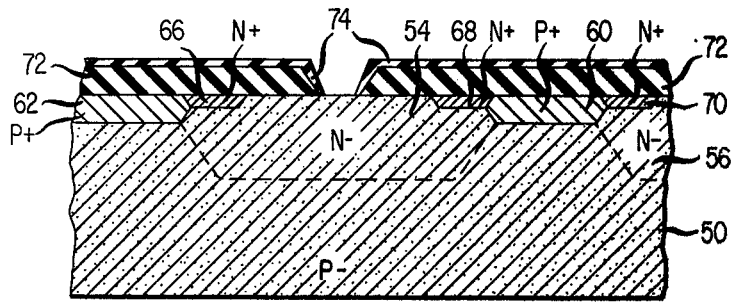

Next, as represented in FIG. 5, a two-element masking layer is formed on the top surface of the substrate 50. This layer comprises, for example, a 5000-Angstrom-thick film 72 of silicon dioxide and a 900-Angstrom-thick film 74 of silicon nitride which serves as a junction seal. In accordance with one aspect of the principles of the present invention, openings are formed in the noted two-element masking layer at selected spaced-apart positions along each of the bit-line regions. Thus, for example, as represented in FIG. 5, an opening in the masking layer is shown above the bit-line region 54. In standard ways known in the art, portions of both the films 72 and 74 are removed from the depicted surface of the region 54 to form, for example, a rectangular opening in the masking layer.

The pattern of openings formed in the two-element masking layer shown in FIG. 5 is selected to correspond respectively to the particular bit pattern that is specified to be embodied in the matrix array 11 of FIG. 1. In a subsequent metallization step described below, Schottky diodes are respectively formed in these openings.

Figure 6:
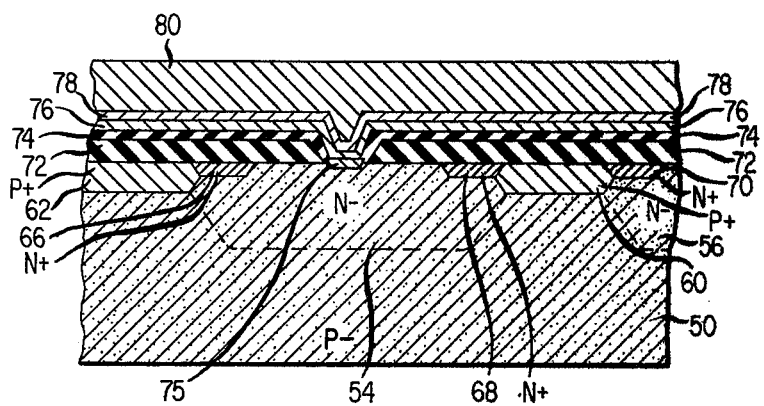

The metallization step, which comprises several sequential procedures and is represented in FIG. 6, is directed at forming plural spaced-apart word lines that are orthogonally disposed with respect to the aforedescribed bit-line regions. Wherever the metallic word lines extend through the noted openings in the two-element masking layer to contact spaced-apart surface portions of then $n^-$ bit-line regions, Schottky diodes are formed.

Metal-to-semiconductor diodes known as Schottky barriers are standard devices in the art. The external voltage-current characteristic of such a diode is essentially the same as that of a p-n junction device. But, advantageously, the voltage drop across a Schottky diode is much less than that of a p-n diode for the same forward current. In addition, Schottky diodes exhibit a negligible storage time which means that they can be switched from ON to OFF in a relatively high-speed way.

In accordance with the principles of the present invention, a Schottky diode is formed in the bit-line regions wherever openings have been made in the aforedescribed two-element masking layer. This is accomplished, for example, by depositing a 0.05-micrometer-thick layer of platinum on the masking layer.

After the platinum-deposition step, the chip structure is heated to about 400° C, which causes the platinum in contact with the semiconductor substrate in openings in the masking layer to be converted to platinum silicide. The unconverted portions of the platinum bands are then removed in a standard way with an etchant. The platinum silicide regions that remain on the structure are represented by region 75 in FIG. 6.

Subsequently, spaced-apart metallization bands each comprising three metallic layers are deposited on the FIG. 6 structure in registry with the bit storage locations to make electrical contact to the previously formed platinum silicide regions. More specifically, the first layer 76 comprises, for example, a 2000-Angstrom-thick film of titanium. The second layer 78 is a 1000-Angstrom-thick film of platinum, and the third layer 80 comprises a 1.0-micrometer-thick film of gold. These three-component bands correspond respectively to the horizontal word lines 12, 13 . . . 137, 138, 139 shown in FIG. 1.

Figure 7:
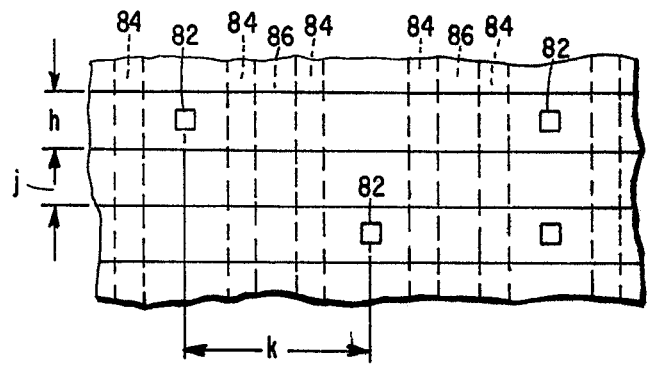
FIG. 7 is a top view of a portion of the aforespecified LSI array.

A top view of a portion of the matrix array 11 whose fabrication has been described above is depicted in FIG. 7. The spaced-apart gold films 80 that form the top members of the aforespecified metallization or word-line bands are indicated in FIG. 7. Also represented therein in dashed-line form and designated by reference numerals 82 are the openings in the masking layer wherein Schottky diodes are formed in the array. Bands 84 in FIG. 7 represent $n^+$ regions that correspond to the conductivity enhancing regions 66, 68 and 70 shown in FIG. 6 and described above. Bands 86 in FIG. 7 represent P+ regions that correspond to the channel-stop regions 60 and 62 in FIG. 6.

Illustratively, each of the openings 82 represented in FIG. 7 measures about 5 by 5 micrometers. By way of example, the films 80 each have a width $h$ of about 10 micrometers and are spaced apart by a distance $j$ of about 6 micrometers. Further, in one particular embodiment, the center-to-center horizontal spacing $k$ of two adjacent openings 82 is approximately 20 micrometers.

During the aforedescribed batch fabrication procedure, plural matrix arrays 11 are made simultaneously on a single semiconductor wafer. At the same time, the extremities of the bit and word lines of each such array are interconnected with the associated units 22, 24, 26, 29 and 30 shown in FIG. 1 to form plural ROM units on each wafer. In this way, plural small-area, high-speed low-cost and low-power ROM devices are made. One specific illustrative ROM unit made in LSI GIMIC-O form in accordance with the principles of the present invention constituted a chip measuring 4.5 by 3.4 millimeters. The access and cycle times of the unit were determined to be less than 200 and 300 nanoseconds, respectively.

Finally, it is to be understood that the abovedescribed procedures and arrangements are only illustrative of the application of the principles of the present invention. In accordance with those principles, numerous other procedures and arrangements may be devised by those skilled in the art without departing from the spirit and scope of the invention. In addition, various known techniques may be incorporated in the particular design described herein. For example, partial power gating, whereby only a portion at a time of the array 11 is powered, may be embodied in the herein-considered unit to minimize the power requirements thereof. Also, the unit may be designed to provide the fabrication option of associating or not an inverter with each of the output leads 32 . . . 39. In that way, the number of Schottky diodes that must be formed in the unit can be minimized.

Additionally, the techniques described herein may also be applied to the more common and standard bipolar technologies which use an n-type epitaxial layer grown on a p-type substrate. In that case the Schottky diodes are formed directly in the n-type epitaxial layer and this layer is patterned into long thin digit lines by a selective isolation (p-type) diffusion. A structure fabricated in this way will, however, generally be larger than one fabricated in the GIMIC-O technology. It is also, of course, possible to use other metallization systems, including, for example, aluminum, molybdenum, tungsten or palladium, to form the hereinspecified Schottky diodes.

What is claimed is:

1. In an integrated circuit read-only-memory unit for storing information in binary form including a semiconductor body having a plurality of highly doped channels forming multiple spaced-apart bit lines, and a plurality of spaced-apart metallic word lines overlying said body and insulated therefrom and orthogonally disposed to said bit lines, each one of said bit lines being interconnected by a separate Schottky diode to any selected ones of said word lines in accordance with the information stored in said memory;

a semiconductor body having (1) a plurality of parallel spaced-apart surface regions of one conductivity type supported within a bulk portion of the opposite conductivity type to form multiple bit lines, each of the regions providing a plurality of regularly spaced-apart memory cell positions dispersed along the longitudinal extent of the bit line, (2) channel-stop surface regions of the same conductivity type as the bulk portions in the spaces between said first-mentioned regions, and (3) at least one surface portion in each of said first-mentioned regions of the same conductivity type but of higher conductivity to enhance the conductivity of said bit lines, a selectively apertured insulating layer overlying the semiconductor body, the apertures in said layer overlying selected ones of regularly spaced-apart memory cell positions, and a plurality of parallel spaced-apart metallic word lines disposed on said insulating layer orthogonal to said bit lines at said memory cell positions to form Schottky diodes wherever portions of said metallic lines extend through apertures in said layer to contact said bit lines, the pattern of apertures corresponding to the particular specified group of information words designed to be stored in said unit.

2. A combination as in claim 1 wherein said bit-line regions comprise ion-implanted $n^-$ regions formed in and near the top surface of said substrate.

3. A combination as in claim 2 wherein said channel-stop regions comprise ion-implanted $p^+$ regions.

4. A combination as in claim 3 wherein said high conductivity portions comprise diffused $n^+$ regions.

5. A combination as in claim 4 wherein said insulating layer comprises a silicon dioxide film on said substrate and a silicon nitride film on said silicon dioxide film.

6. A combination as in claim 5 wherein said metallic lines each comprise
- platinum silicide regions in said apertures in contact with said bit-line regions,
- a titanium film on said insulating layer interconnecting any platinum silicide regions lying thereunder,
- a platinum film on said titanium film,
- and a gold film on said platinum film.

7. A combination as in claim 4 wherein said surface portions of higher conductivity to enhance the conductivity of said bit lines comprises two such portions located adjacent to and within the longitudinal edges of said bit lines.

8. A method for fabricating a small-area ROM unit in LSI form comprising the steps of
- forming a semiconductor body having a plurality of parallel spaced-apart surface regions of one conductivity type supported within a bulk portion of the opposite conductivity type to form multiple bit lines,
- forming channel-stop surface regions of the same conductivity type as the bulk portions in the spaces between said first-mentioned regions, and
- forming at least one surface portion of the same conductivity type in each of said first-mentioned regions but of higher conductivity to enhance the conductivity of said bit lines,
- depositing a selectively apertured insulating layer overlying the semiconductor body.
- and forming a plurality of parallel spaced-apart metallic word lines disposed on said insulating layer orthogonal to said bit lines at said memory cell positions to form Schottky diodes wherever portions of said metallic lines extend through apertures in said layer to contact said bit lines.

9. A method as in claim 8 wherein each of said first- and second-recited forming steps comprises an ion implantation step and wherein said third-recited forming step comprises a diffusion step.

* * * * *